United States Patent
Nagaraj et al.

(10) Patent No.: US 6,646,584 B2
(45) Date of Patent: *Nov. 11, 2003

(54) CIRCUIT DESIGN TECHNIQUE FOR INCREASING THE BANDWIDTH OF SAMPLE-AND-HOLD CIRCUITS IN FLASH ADCS

(75) Inventors: Krishnasawamy Nagaraj, Somerville, NJ (US); David A. Martin, Atlantic Highlands, NJ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/992,904

(22) Filed: Nov. 14, 2001

(65) Prior Publication Data

US 2002/0070886 A1 Jun. 13, 2002

Related U.S. Application Data

(60) Provisional application No. 60/253,618, filed on Nov. 28, 2000.

(51) Int. Cl.[7] .............................................. H03M 1/12
(52) U.S. Cl. ...................................... 341/155; 341/156
(58) Field of Search .............................. 341/155, 156, 341/122, 154, 136; 327/75

(56) References Cited

U.S. PATENT DOCUMENTS

| 4,183,016 A | * | 1/1980 | Sawagata ..................... 327/75 |
| 5,450,085 A | * | 9/1995 | Stewart et al. ............... 341/156 |
| 5,534,864 A | * | 7/1996 | Ono et al. ................... 341/156 |
| 6,369,743 B2 | * | 4/2002 | Ono ............................ 341/118 |

* cited by examiner

*Primary Examiner*—Jean Bruner Jeanglaude
(74) *Attorney, Agent, or Firm*—W. Daniel Swayze, Jr.; W. James Brady; Frederick J. Telecky, Jr.

(57) ABSTRACT

An analog-to-digital converter to convert an analog signal to a digital signal, including a sample-and-hold circuit to sample and hold the analog signal and to output a held signal, a buffer circuit to buffer the held signal to output a buffered signal, and a comparator circuit to compare the buffered signal with a reference voltage.

4 Claims, 2 Drawing Sheets

CIRCUIT DESIGN TECHNIQUE FOR INCREASING THE BANDWIDTH OF SAMPLE-AND-HOLD CIRCUITS IN FLASH ADCS

This application claims priority under 35 USC §119(e)(1) of provisional application Serial No. 60/253,618, filed Nov. 28, 2000.

FIELD OF THE INVENTION

The present invention relates to analog-to-digital converters and particularly to analog-to-digital converters having a very high operating clock frequency.

BACKGROUND OF THE INVENTION

Conventional high-speed, analog-to-digital converters ("ADCs") commonly employ a full flash architecture in which the analog-to-digital conversion is done in parallel by using approximately $2^N$ voltage comparators. An input voltage and fractional portions of a reference voltage are applied simultaneously to each comparator. The fractional portions of the reference voltage are obtained by dividing the reference voltage into equal increments by resistors. The output of each comparator is generally applied to a decoder which decodes such received inputs into a multi-bit digital output representative of the input voltage.

A block diagram of a flash ADC is illustrated in FIG. 5. One problem with such ADCs is that the comparators of the ADCs can have large offsets which generate errors in the digital output. During the auto-zero cycle, the comparator's output is connected to its input through switch 1702. The capacitor 1704 is connected to the resistance ladder 1706 through switch 1712 instead of the output of the sample-and-hold circuit 1710. This stores both the reference level and the offset information on the capacitor 1704 so that the sample-and-hold circuit 1710 is reconnected to the capacitor 1704 through switch 1708. The input to the comparator 1714 is now equal to the output of the sample-and-hold circuit 1710 minus the reference voltage and minus the comparator offset. One problem with the technique corresponding to the circuit illustrated in FIG. 5 is that the switch 1708 connecting the sample-and-hold circuit 1710 to the coupling capacitor 1704 forms a low-pass RC filter with the input capacitance of the comparator 1714. This limits the bandwidth of the sample-and-hold circuit 1710. One solution to this problem is to use a pass transistor with a high width-to-length ratio and a high gate drive. However, with a low supply voltage that are currently available, this becomes more difficult. With an ADC to operate in the 1 Gbit range, this solution has been identified as one of the bottlenecks that ultimately limits the speed of the ADC. Thus, it is necessary to eliminate the low-pass RC filter.

The comparators that are described above are normally implemented using conventional auto-zero voltage comparators. An auto-zero voltage comparator generally requires a two-phase clock for auto-zeroing in the first phase and for actual signal comparison in the second phase. However, such two-phase design limits the maximum achievable operating frequency to a factor of two lower than otherwise possible, other factors being equal, if non-auto-zero voltage comparators are employed.

SUMMARY OF THE INVENTION

The present invention provides an analog-to-digital converter without a switch between the sample-and-hold circuit and the comparator. This eliminates the RC filter which forms a bottleneck between the sample-and-hold circuit and the rest of the ADC. As a consequence, the speed of the ADC can be increased.

DETAILED DESCRIPTION OF THE PRESENT INVENTION

Figure 2:
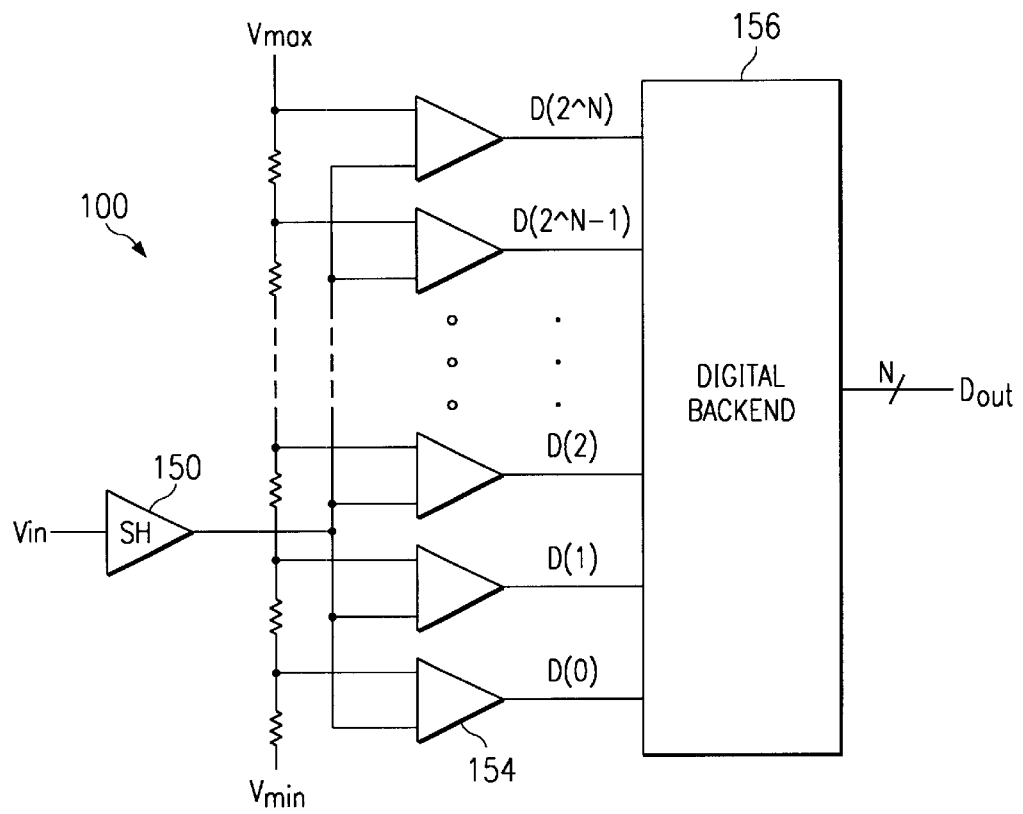
FIG. 2 illustrates an additional interface between the sample-and-hold circuit and a comparator.

An ADC of the present invention is illustrated in FIG. 2. The input of the ADC circuit 100 is illustrated by sample-and-hold circuit 150. The input signal is sampled and held by the sample-and-hold circuit 150. The output from the sample-and-hold circuit 150 is input to the comparator array 154. The comparator array 154 converts the input signal from the sample-and-hold circuit 150 to a digital thermometer code. The output of the comparator array 154 is input to digital logic (not shown) which formats the digital output.

The sample-and-hold circuit 150 can be either single-ended or differential.

Figure 1:
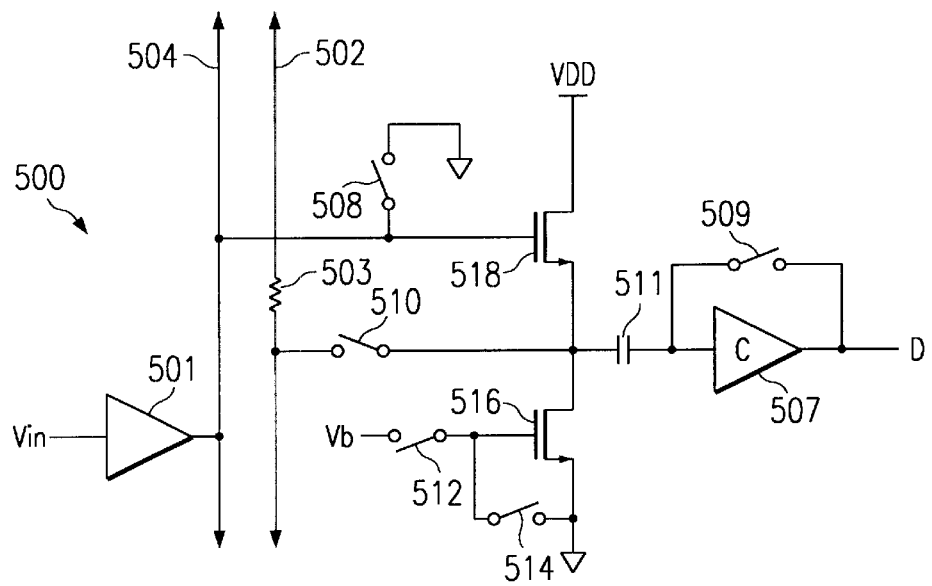
FIG. 1 illustrates a circuit diagram in accordance with the present invention.

FIG. 1 illustrates the apparatus of the improved comparator design.

The input voltage is input to sample-and-hold circuit 501 which outputs the input signal to bus 504. The sample-and-hold circuit 501 holds the input signal after the input signal is sampled and outputs the held signal. Additionally, a resistance ladder 502 is biased by a reference voltage through a series of resistors to produce a plurality of reference voltages. One such resistor of the resistance ladder 502 is illustrated as element 503. Connected to the input bus 504 is switch 508 and transistor 518. Connected to the resistance ladder 502 at one end of resistor 503 is switch 510, which is connected to transistors 518 and 516. Additionally, the switch 510 is connected to capacitor 511, which is shown as capacitor 1704 in FIG. 3. Connected to voltage $V_b$ is switch 512 which is additionally connected to switch 514. The switch 512 is connected to the gate of transistor 516 as well as the switch 514. The drain of transistor 518 is connected to voltage $V_{DD}$. The gate of transistor 518 is connected to the input bus 504 as well as switch 508. The source of transistor 508 is connected to transistor 516. Transistors 516 and 518 are illustrated in FIG. 1 as n type field effect NFET transistors, but other types of transistors are used. The drain of transistor 516 is connected to the source of transistor 518. The gate of transistor 516 is connected to switch 512, and the source of transistor 516 is connected to switch 514. During normal operation, switches 508, 510 and 514 are turned off. Transistors 518 and 516 form a buffer from the input bus 504 to the capacitor 501 to buffer the held signal, and there is no series switch in the input path.

As described above, during the auto-zero cycle, the comparator 507 has an output connected to the input of the comparator 507 through switch 509. During the auto-zero cycle, switch 509 is closed to provide this connection. The capacitor 511 is connected to the resistance ladder through switch 510. During an auto-zero cycle switches 508 and 514 are closed which turns off transistors 516 and 518, effectively turning off the buffer. The reference voltage and any offset voltage of comparator 507 are now stored on to capacitor 511.

Figure 3:
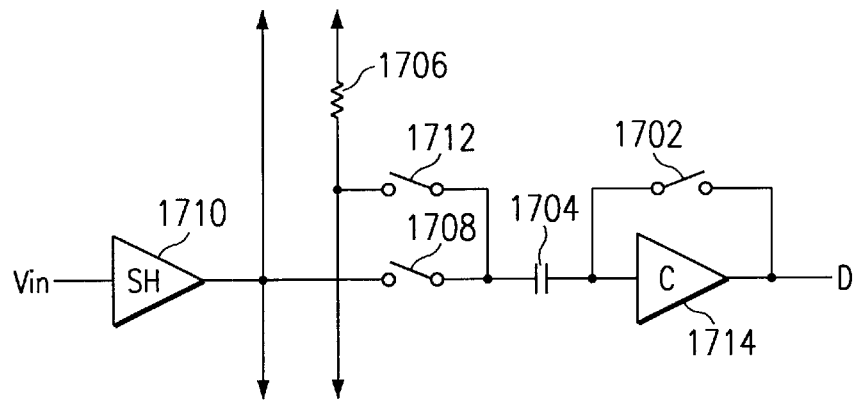
FIG. 3 illustrates a flash ADC.

The capacitive load on the sample-and-hold circuit 502 in FIG. 1 is much less than the load on the sample-and-hold circuit 1710 in the original design shown in FIG. 3. Therefore, the power used by the sample-and-hold circuit 502 in FIG. 1 is greatly reduced. This compensates for the increase in power used by transistors 518 and 516 in FIG. 1.

Transistors 516 and 518 in FIG. 1 form a tristate buffer. Other designs for analog tristate buffers could also be used.

A problem that still exists in the circuit of FIG. 1, is the offset voltage of the tristate buffer. This offset is not cancelled by the auto-zero operation.

Figure 4:
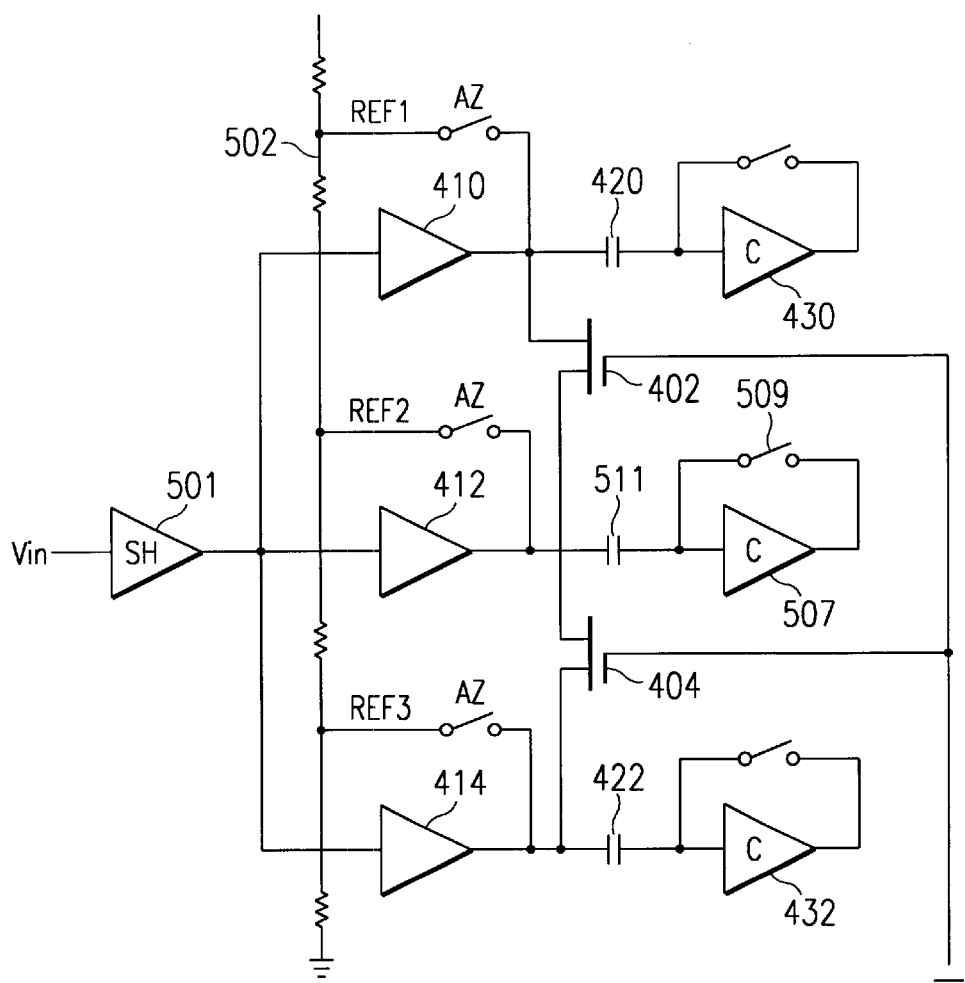
FIG. 4 illustrates a circuit to remove offset voltages from the inputs of comparators.

FIG. 4 illustrates a circuit to remove the offset voltages of the buffers. As illustrated, switches 452 and 444 which are illustrated are MOSFET transistors, are used to eliminate the offset voltages between the buffers 410, 412 and 414. During the auto-zero operations switches 452 and 444 are turned off, allowing capacitors 420, 511 and 422 to be charged to a different reference voltage. During normal operation switches 452 and 444 turned on. This effectively shorts the output of buffers 410, 412 and 414 together, thus minimizing the effect of any offsets between them.

Although the invention has been described and illustrated with reference to specific embodiments, it is not intended that the invention be limited to those illustrative embodiments. Those skilled in the art will recognize that modifications and variations may be made without departing from the spirit and scope of the invention.

What is claimed is:

1. An analog-to-digital converter to convert an analog signal to a digital signal, comprising:
   a sample-and-hold circuit to sample and hold said analog signal and to output a held signal;
   a buffer circuit to buffer said held signal to output a buffered signal;
   a comparator circuit connected to said buffer circuit to compare said buffered signal with a reference voltage; and
   a switch connecting the input of said comparator circuit to a reference voltage,
   wherein said buffer circuit is a two-transistor circuit including a source follower transistor and a current source transistor.

2. An analog-to-digital converter to convert an analog signal to a digital signal, comprising:
   a sample-and-hold circuit to sample and hold said analog signal and to output a held signal;
   a buffer circuit to buffer said held signal to output a buffered signal;
   a comparator circuit connected to said buffer circuit to compare said buffered signal with a reference voltage; and
   a switch connecting the input of said comparator circuit to a reference voltage,
   wherein said buffer circuit is an analog tristate.

3. An analog-to-digital converter to convert an analog signal to a digital signal, comprising:
   a sample-and-hold circuit to sample and hold said analog signal and to output a held signal;
   a buffer circuit to buffer said held signal to output a buffered signal;
   a comparator circuit connected to said buffer circuit to compare said buffered signal with a reference voltage; and
   a switch connecting the input of said comparator circuit to a reference voltage,
   wherein said buffer circuit is a field effect transistor (FET) having a gate connected to said sample-and-hold circuit.

4. An analog-to-digital converter as in claim 3, wherein said FET includes a source connected to said comparator.

* * * * *